United States Patent
Bothra et al.

(10) Patent No.: US 6,229,685 B1
(45) Date of Patent: May 8, 2001

(54) THIN CAPACITIVE STRUCTURES AND METHODS FOR MAKING THE SAME

(75) Inventors: Subhas Bothra, Fremont; Dipankar Pramanik, Saratoga; Calvin T. Gabriel, Cupertino, all of CA (US)

(73) Assignee: Philips Electronics North America Corp., New York, NY (US)

( * ) Notice: Subject to any disclaimer, the term of this patent is extended or adjusted under 35 U.S.C. 154(b) by 0 days.

(21) Appl. No.: 09/467,734

(22) Filed: Dec. 20, 1999

(51) Int. Cl.$^7$ .................................................. H01G 4/228
(52) U.S. Cl. .................... 361/306.3; 361/311; 361/321.3
(58) Field of Search ................................. 361/303, 306.3, 361/311–313, 321.1–321.5

(56) References Cited

U.S. PATENT DOCUMENTS 5,142,437 * 8/1992 Kammerdiner et al. ............. 361/313
6,146,996 * 11/2000 Sengupta ............................. 438/639

* cited by examiner

Primary Examiner—Anthony Dinkins
(74) Attorney, Agent, or Firm—Martine Penilla & Kim, LLP (57) ABSTRACT

A capacitor and a method of making the capacitor is provided. The capacitor includes a metallization line with a high dielectric constant layer defined over the metallization line. A thin metallization film is defined over the high dielectric constant layer, such that the thin metallization film defines a top plate of the capacitor, the high dielectric constant layer defines a dielectric for the capacitor, and the metallization line defines a bottom plate for the capacitor. The metallization line is defined from a metallization level and the thin metallization film is defined before a next metallization level above the metallization level is defined.

9 Claims, 8 Drawing Sheets

THIN CAPACITIVE STRUCTURES AND METHODS FOR MAKING THE SAME

BACKGROUND OF THE INVENTION

1. Field of the Invention

The present invention relates to capacitors within devices of semiconductor chips, and more particularly, to the formation of capacitors within a semiconductor device.

2. Description of the Related Art

Today's semiconductor devices are continually being pushed to meet stricter demands. As devices using this technology inundate the marketplace, consumers place higher demands on them. These demands include smaller, more compact devices with greater functionality.

For instance, some semiconductor applications require the integration of both digital circuitry and radio frequency (RF) circuitry in the same chip. To accomplish this, it is necessary to fabricate very specific capacitive structures. Such applications include, for example, cellular phones, portable communication devices, and other electronic devices that implement both digital and RF circuitry. In specific applications, the capacitive structures are used in RF signal processing to eliminate both low frequency components as well as direct current (DC) components from an RF signal. To date, semiconductor manufacturers have been forced to fabricate capacitors from portions of metallization lines.

The separate metallization line was required to form the individual plates necessary for a capacitor. One metallization line was required to form the top plate of the capacitor and another metallization line was required to form the bottom plate of a capacitor. The metallization line used for the capacitor would therefore not be available for routing signals in the particular metallization level. As such, if the integrated circuit design was designed to have dense interconnect routing, the simple implementation of a capacitor would sometimes force the addition of another metallization level to complete the required routing. This, of course, increased the size of a chip and cost of the semiconductor device. In addition, the larger a chip becomes, the more expensive it will be to package the device. Additionally, the capacitance of the capacitors used in the prior art was not that high because of the materials used for the capacitor. The prior art used standard dielectric material between the lines, as is typically done with standard interconnect structures. As a result, designers would frequently not be able to rely on these type of capacitors either because not enough capacitance was generated or because the structure became too large for the particular application. For instance, if the capacitor were too small, the function of filtering low frequency signals and/or DC signals could not be adequately accomplished.

In some cases, designers are forced to implement discrete components such as capacitors outside of the chip (i.e., on the printed circuit board) in order to complete the desired function. This also increases the cost of the resulting device.

In view of the foregoing, there is a need for a method of making capacitors in standard interconnect metallization structures. There is also a need for capacitor structures that do not occupy standard routing space on metallization levels within a semiconductor device. Additionally, there is a need for a capacitor with better performance characteristics, which can be fabricated without expensive non-standard fabrication operations.

SUMMARY OF THE INVENTION

Broadly speaking, the present invention fills these needs by providing a capacitor that has better performance characteristics and may be fabricated without expensive non-standard fabrication operations. It should be appreciated that the present invention can be implemented in numerous ways, including as a process, an apparatus, a system, a device, or a method. Several inventive embodiments of the present invention are described below.

In one embodiment, a capacitor is disclosed. The capacitor includes a metallization line with a high dielectric constant layer defined over the metallization line. The high dielectric constant layer has a thin metallization film defined over it such that the thin metallization film defines a top plate of the capacitor. The high dielectric constant layer defines a dielectric for the capacitor, and the metallization line defines a bottom plate for the capacitor. The metallization line is defined from a metallization level and the thin metallization film is defined before a next metallization level above the metallization level is defined.

In another embodiment, a method for making a capacitor is disclosed. A metallization line is first defined with a high dielectric constant layer formed over the metallization line. A thin metallization film is then formed over the high dielectric constant layer such that the thin metallization film defines a top plate of the capacitor. The high dielectric constant layer defines a dielectric of the capacitor with the metallization line defining a bottom plate of the capacitor. The metallization line is defined from a metallization level and the thin metallization film is defined before a next metallization level.

In a further embodiment, a capacitor is disclosed. The capacitor includes a bottom plate, a dielectric and a top plate over the dielectric. The bottom plate is defined from a metallization line and the dielectric is made from a high dielectric constant layer disposed over the bottom plate. The top plate is defined from a thin metallization film that is disposed over the high dielectric constant layer. The thin metallization film is defined such that it is between the metallization line and a next metallization layer.

The many advantages of the current invention should be recognized. The present invention allows for the formation of a capacitor within a semiconductor device without the addition of extra metallization layers. The capacitor is made over a metallization layer before the next metallization layer is formed. Therefore, the present invention does not require extra or special space within the semiconductor device for formation. The present invention is fabricated using standard fabrication techniques for semiconductor devices, thus no special or time consuming fabrication steps are required. Also, the present capacitor has the ability of having a higher capacitance than the prior art while using less space, thereby increasing its ability to filter low frequency and/or DC signals. Consequently, a capacitor made in accordance with the present invention allows designers to make semiconductor devices having capacitors which may be packaged more efficiently without greatly increasing the cost or time of fabrication with the added advantage of having higher capacitance.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention for a capacitor that only requires one metallization layer, and methods for making the capacitor are disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
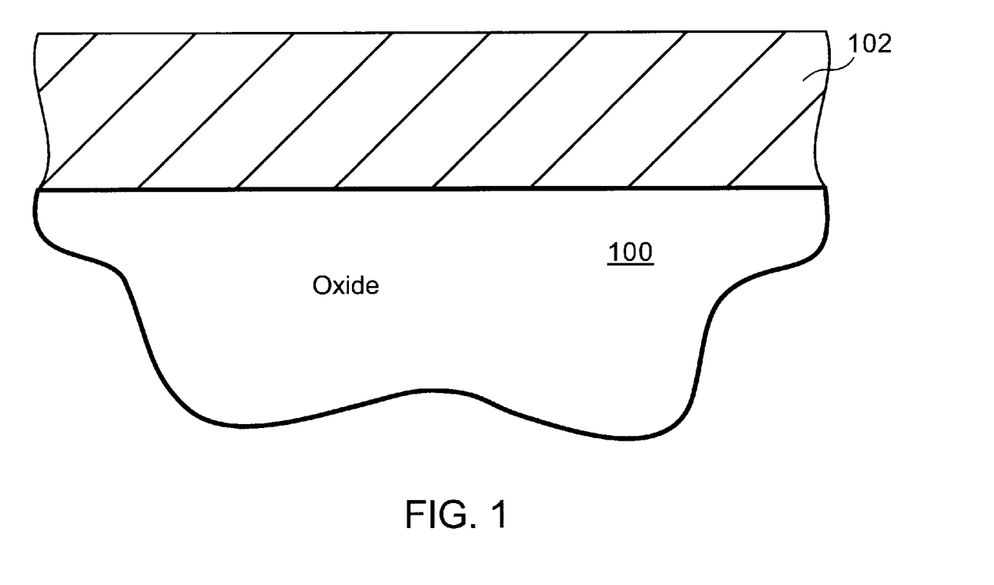
FIG. 1 shows a metallization layer sputtered over an oxide layer in accordance with an embodiment of the present invention.

The following illustrates the preferred process operations implemented to make a capacitive structure of the present invention. FIG. 1 shows a metallization layer 102 sputtered over an oxide layer 100. The oxide layer 100 may be any inter-metal dielectric. Also, the oxide layer 100 may be located on any level within a semiconductor device. For example, the oxide level 100 may be on top of another metallization layer (not shown) or over a substrate (not shown). The metallization layer 102 may be on any metallization level. The metallization layer 102 has a thickness that is preferably between about 4000 Angstroms and about 20000 Angstroms, and more preferably about 8000 Angstroms.

Figure 2:
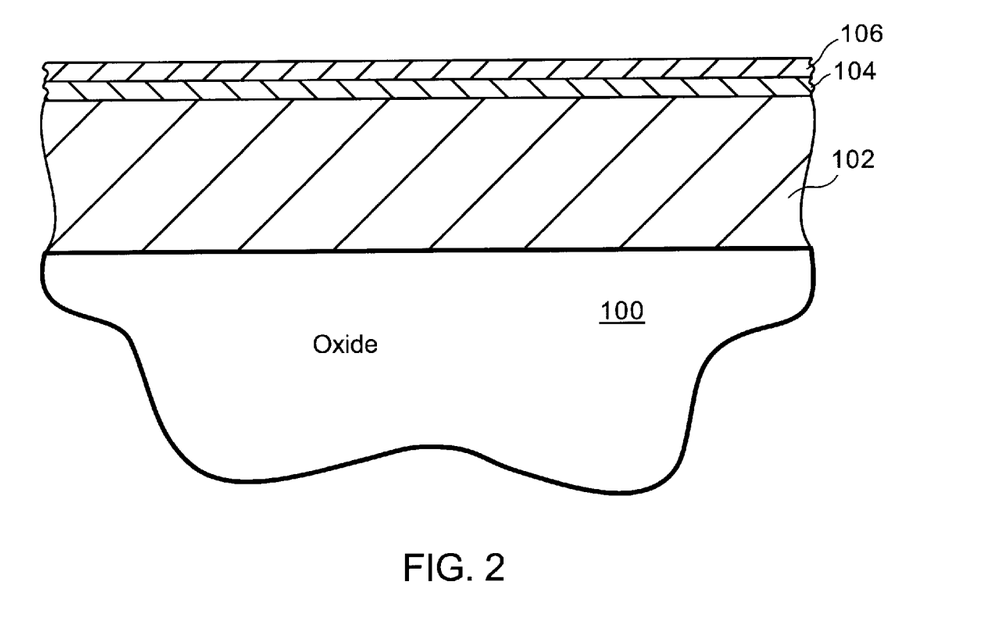
FIG. 2 illustrates the deposition of a high dielectric constant layer and the deposition of a thin metallization film over the high dielectric constant layer.

FIG. 2 illustrates the deposition of a high dielectric constant layer 104 and the deposition of a thin metallization film 106 over the high dielectric constant layer 104. It should be noted that the thin metallization film 106 does not define another interconnect layer of the semiconductor device, but will be used as the conductive material of a later defined top plate of the capacitive structure. Thus, the thin metallization film 106 is defined before a next interconnect metallization layer is formed above the metallization layer 102. The high dielectric constant layer 104 is preferably deposited to a thickness between about 200 Angstroms and about 2000 Angstroms, and more preferably about 500 Angstroms. In accordance with one embodiment of the present invention, the high dielectric constant layer 104 is preferably silicon nitride (SiN). However, the high dielectric constant layer may also be any other dielectric having a dielectric constant that is high enough for the application in which the capacitive structure is to be used. For example, the high dielectric constant layer 104 may be tantalum oxide ($TaO_2$), or other known oxides. The thin metallization film 106 is preferably deposited to a thickness of between about 200 Angstroms and about 1000 Angstroms, and more preferably of about 500 Angstroms. The thin metallization film 106 may be any conductive material, however, in one preferred embodiment, the thin metallization film 106 is titanium nitride (TiN).

Figure 3A:
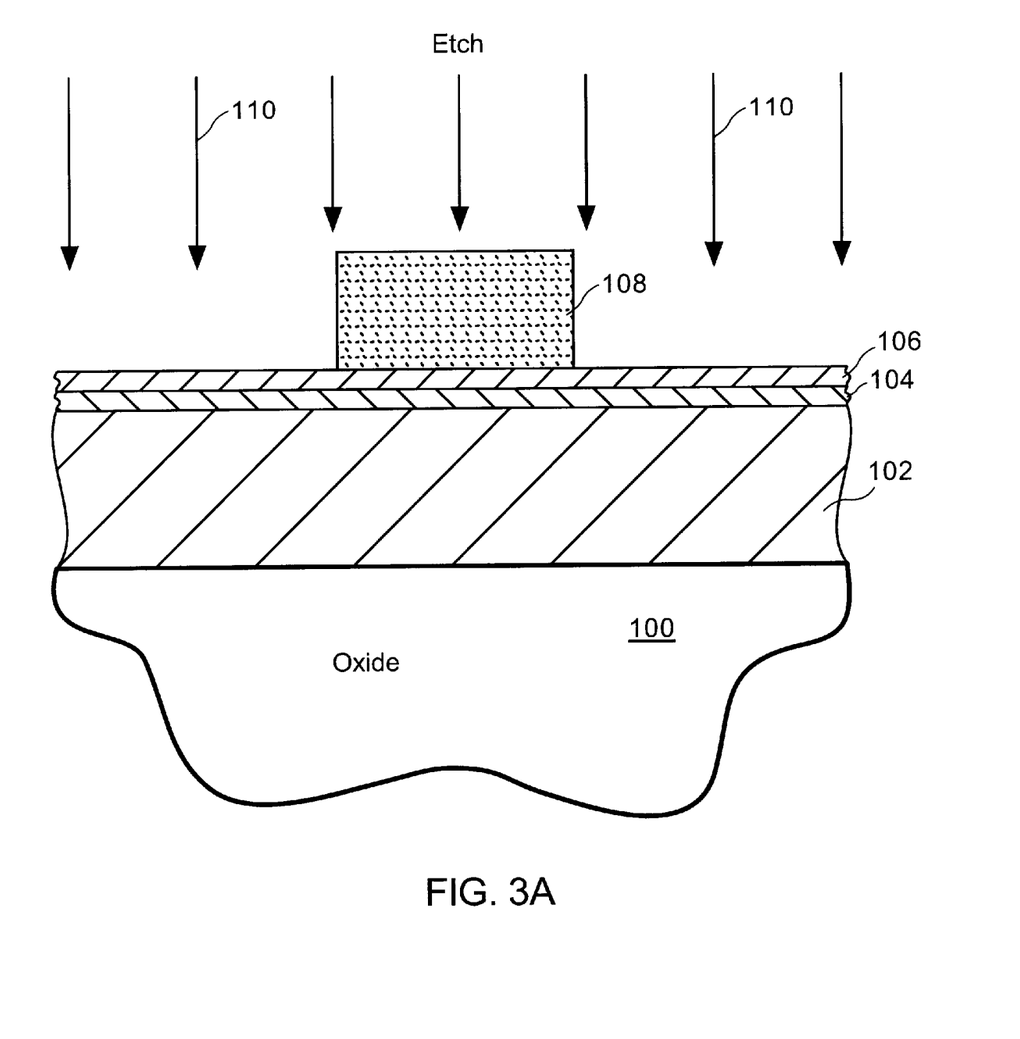
FIG. 3A shows the patterning of the thin metallization film, in accordance with one embodiment of the present invention.
Figure 3B:
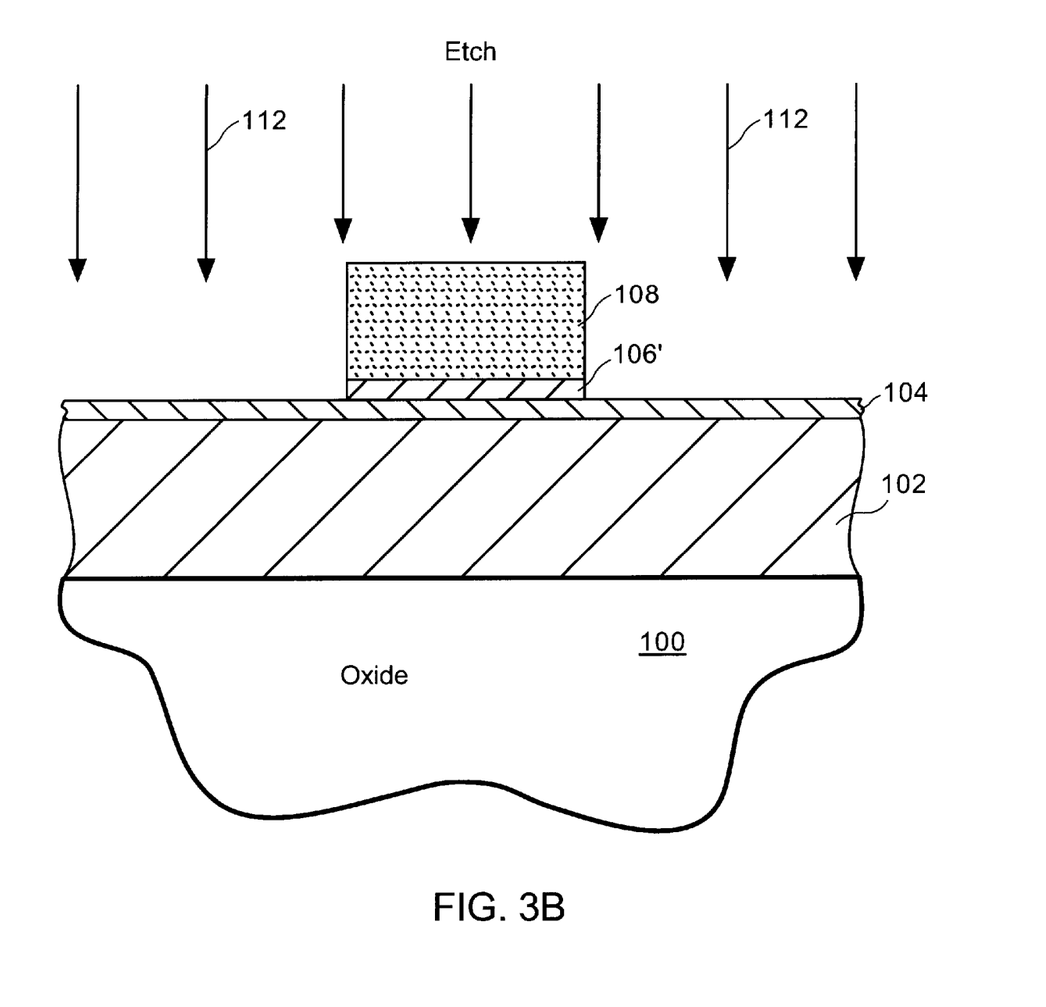
FIG. 3B illustrates the patterning of the high dielectric constant layer in accordance with one embodiment of the present invention.

FIG. 3A shows the patterning of the thin metallization film 106, in accordance with one embodiment of the present invention. A photoresist layer is preferably spin coated over the thin metallization film 106 and then patterned using standard photolithography techniques. The patterning is configured to define a patterned photoresist mask 108 over the thin metallization film 106. A titanium etch operation 110 is then performed over the patterned photoresist 108 and the thin metallization film 106 to form a patterned metallization layer 106' as shown in FIG. 3B. In accordance with one embodiment of the invention, the titanium etch operation 110 may be performed in a Lam Research Corp. TCP 9600SE metal etcher, available from Lam Research Corporation of Fremont, Calif. In one embodiment of the current invention, the etch process may be performed according to the exemplary parameters set forth in Table A below.

TABLE A

| Main etch chamber | Step 01 | Step 02 | TiN Endpoint Step 03 | Overetch Step 04 | Step 05 | Step 06 |
|---|---|---|---|---|---|---|
| Pressure (mT) | 90.00 | 10.00 | 10.00 | 10.00 | 90.00 | 0.00 |
| RF-Top (W) | 0 | 0 | 450 | 450 | 0 | 0 |
| RF-Bottom (W) | 0 | 0 | 135 | 135 | 0 | 0 |
| Gap (cm) | N/A | N/A | N/A | N/A | N/A | N/A |
| BCl3 (sccm) | 0.0 | 60.0 | 60.0 | 60.0 | 0.0 | 0.0 |
| Cl2 (sccm) | 0.0 | 60.0 | 60.0 | 60.0 | 0.0 | 0.0 |
| N2 (sccm) | 0.0 | 11.0 | 11.0 | 11.0 | 0.0 | 0.0 |
| He clamp (T) | 0.0 | 10.0 | 10.0 | 10.0 | 0.0 | 0.0 |
| Completion | Time | Stabl | EndPt | Overetch | Time | End |
| Time | 10 s | 30 s | 25 | 30% | 10 s | s |
| Channel | | | A | | | |
| Delay (sec) | | | 8 | | | |
| Norm (sec) | | | 2 | | | |
| Norm value | | | 0 | | | |
| Trigger (%) | | | 90 | | | |

The patterned metallization layer 106' defines a top plate of a capacitor that will be formed between the patterned metallization layer 106' and a portion of the metallization layer 102 with the high dielectric constant layer 104 as the dielectric.

FIG. 3B illustrates the patterning of the high dielectric constant layer 104. In this embodiment, if the high dielectric constant layer 104 is SiN, a silicon nitride etch operation 112 is performed over the patterned photoresist 108 and the high dielectric constant layer 104. Of course, if the high dielectric constant layer 104 were made of another material, the etching operation would be optimized for that etch operation. In one embodiment of the present invention, the etch operation 112 may be done in a Lam Research Corporation 4520 dielectric etcher, which is available from Lam Research Corporation in Fremont, Calif. An exemplary etch recipe for etch operation 112 is shown below in Table B.

Figure 4:
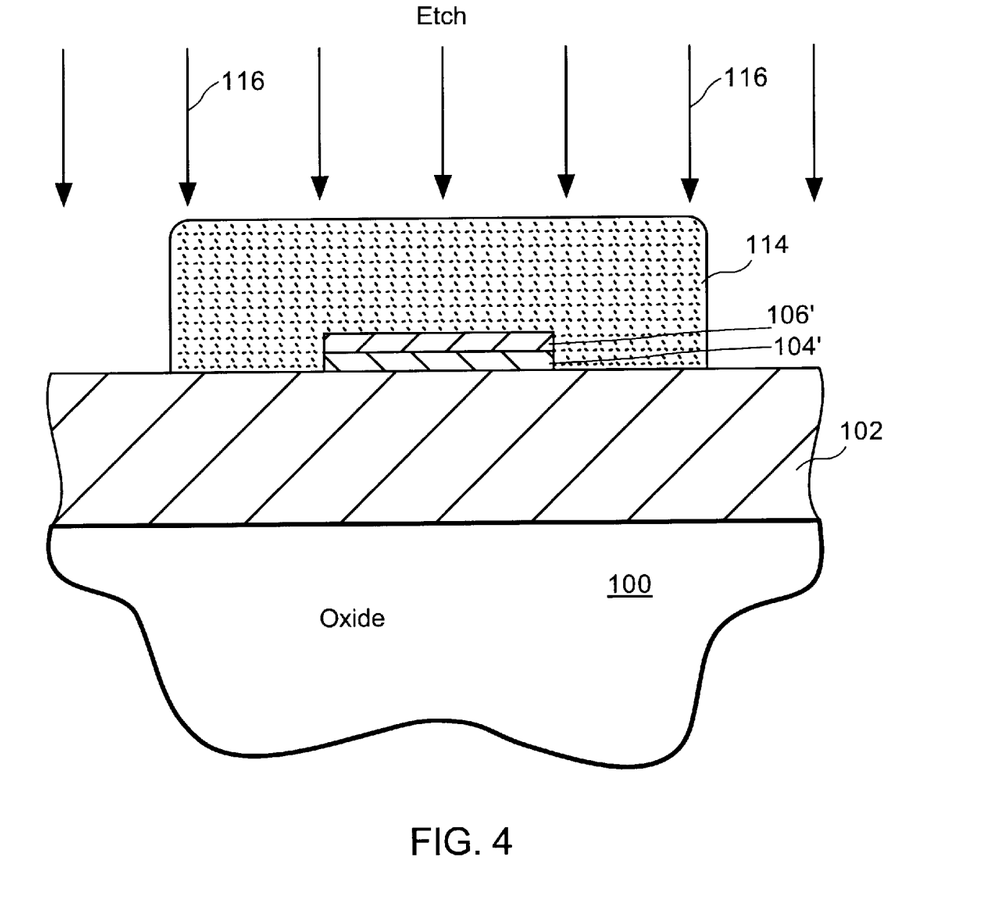
FIG. 4 shows the patterning of a metallization layer in accordance with one embodiment of the present invention.

FIG. 4 shows the patterning of metallization layer 102. A patterned photoresist layer 114 is defined over the patterned metallization layer 106', the high dielectric layer 104' and the metallization layer 102. The photoresist layer 114 is patterned using standard photolithography techniques. Because the patterned metallization layer 106' and the high dielectric constant layer 104' are thin relative to the thickness of the metallization layer 102, the photoresist layer 114 does not experience substantial topographic variations. As is well known, if the topographic variations are substantial, those variations can introduce optical proximity problems during photolithography.

A metal etch operation 116 is performed once the photoresist layer 114 is patterned to pattern the metallization layer

TABLE B

| Step | Step 1 | Step 2 | Power Ramp Step 3 | SiN etch Step 4 | Dechuck Step 6 | Dechuck Step 7 | Dechuck Step 8 |
|---|---|---|---|---|---|---|---|
| Pressure (mT) | 500 | 400 | 400 | 400 | 300 | 300 | 300 |
| RF (W) | 0 | 0 | 700 | 1400 | 0 | 0 | 0 |
| LoFAT Tap | 4 | 4 | 4 | 4 | 0 | 0 | 0 |
| ESC (V) | 2000 | 600 | 600 | 600 | −1 | −2000 | 0 |
| Gap (cm) | 1.250 | 1.250 | 1.250 | 1.250 | 5.530 | 5.530 | 5.530 |
| Ar (sccm) | 100 | 400 | 400 | 400 | 100 | 100 | 100 |
| $CF_4$ (sccm) | 0 | 60 | 60 | 60 | 0 | 0 | 0 |
| $CHF_3$ (sccm) | 0 | 15 | 15 | 15 | 0 | 0 | 0 |
| He Clamp (T) | 0 | 10 | 10 | 10 | 0 | 0 | 0 |
| Lifter Pos | Down | Down | Down | Down | Down | Down | Up |
| Completion | Time | Stabl | Time | Time | Time | Time | End |
| Time (sec) | 4 | 30 | 2 | 15 | 1 | 4 | 30 |

The patterned high dielectric constant layer 104 defines the location of a dielectric of the capacitor that will be formed between the patterned metallization layer 106' and a portion of the metallization layer 102. After the etch operations 110 and 112 are completed, the patterned metallization layer 106' and high dielectric constant layer 104' are defined, as shown in FIG. 4.

Figure 5:
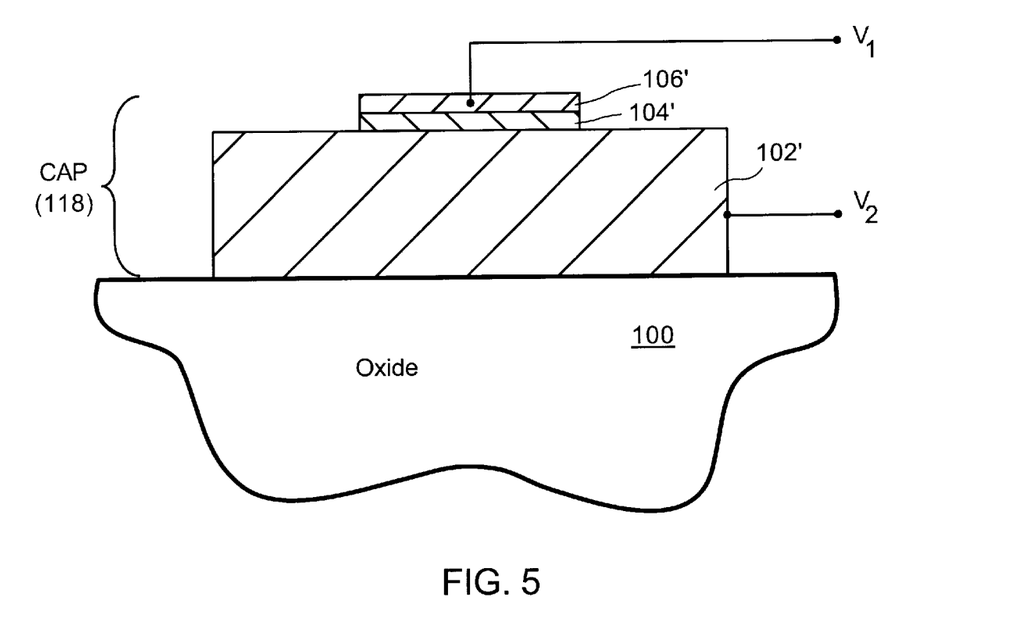
FIG. 5 shows a capacitor (Cap) made in accordance with one embodiment of the present invention.

102. The metal etch operation 116 results in the patterned metallization line 102' as shown in FIG. 5. Although not shown, the same metal etch operation 116 is used to define all of the needed patterning of the metallization layer 102 to define desired interconnect metal lines. The metal etch operation 116 may be performed in a Lam Research Corporation TCP 9600SE metal etcher in accordance with one embodiment of the present invention. The exemplary parameters for the etch operation are set forth below in Table C.

TABLE C

| Main etch chamber | Step 01 | Step 02 | TiN + Al Bulk Step 03 | Endpoint Step 04 | Copper Residue Step 05 | TiN + Overetch Step 06 | Step 07 | Step 08 |
|---|---|---|---|---|---|---|---|---|
| Pressure (mT) | 90.00 | 10.00 | 10.00 | 10.00 | 10.00 | 10.00 | 90.00 | 0.00 |
| RF-Top (W) | 0 | 0 | 450 | 450 | 450 | 450 | 0 | 0 |
| RF-Bottom (W) | 0 | 0 | 135 | 300 | 300 | 135 | 0 | 0 |
| Gap (cm) | N/A | N/A | N/A | N/A | N/A | N/A | N/A | N/A |
| BCl3 (sccm) | 0.0 | 60.0 | 60.0 | 60.0 | 75.0 | 75.0 | 0.0 | 0.0 |
| Cl2 (sccm) | 0.0 | 60.0 | 60.0 | 60.0 | 45.0 | 45.0 | 0.0 | 0.0 |
| N2 (sccm) | 0.0 | 11.0 | 11.0 | 11.0 | 0.0 | 0.0 | 0.0 | 0.0 |
| He clamp (T) | 0.0 | 10.0 | 10.0 | 10.0 | 10.0 | 10.0 | 0.0 | 0.0 |
| Completion | Time | Stabl | Time | EndPt | Time | Time | Time | End |
| Time | 10 s | 30 s | 10 s | 125 s | 5 s | 45 s | 10 s | s |
| Channel | | | | A | | | | |
| Delay (sec) | | | | 35 | | | | |
| Norm (sec) | | | | 5 | | | | |
| Norm value | | | | 0 | | | | |
| Trigger (%) | | | | 110 | | | | |

FIG. 5 shows a capacitor 118 (Cap) made in accordance with one embodiment of the present invention. The capacitor 118 is defined by the patterned metallization layer 106', the patterned high dielectric constant layer 104' and the patterned metallization layer 102'. The patterned metallization layer 106' acts as the top plate of the capacitor 118. The high dielectric constant layer 104' serves as a dielectric for the capacitor 118 and the patterned metallization line 102' acts as the bottom plate for the capacitor 118. The thickness of the high dielectric constant layer 104' is relatively small, therefore this allows the top plate of the capacitor 118, patterned metallization layer 106', to be in close proximity to the metallization layer 102'. In addition, the high dielectric constant layer 104' has a high dielectric constant. Therefore, the high dielectric constant along with the close proximity of the bottom plate to the top plate allows the capacitor to have a high capacitance for those applications in which high capacitance is needed.

For purposes of illustration, FIG. 5 shows the capacitor 118 in electrical communication with a voltage source $V_1$ and a voltage source $V_2$. The patterned metallization line 102' is in electrical communication with a bottom voltage potential $V_2$. The bottom voltage potential $V_2$ may be connected to any voltage source (not shown) or to a ground connection. Also shown in FIG. 5 is the patterned metallization layer 106' in communication with a top voltage potential $V_1$. The top voltage potential $V_1$ is connected to a voltage source (not shown) that provides voltage to the patterned metallization layer 106'. In order to charge the capacitor 118, the top voltage potential $V_1$ should have a voltage different from the bottom voltage potential $V_2$. The top voltage potential $V_1$ may be in communication with another metallization level, as will be shown with reference to FIG. 7.

Figure 6:
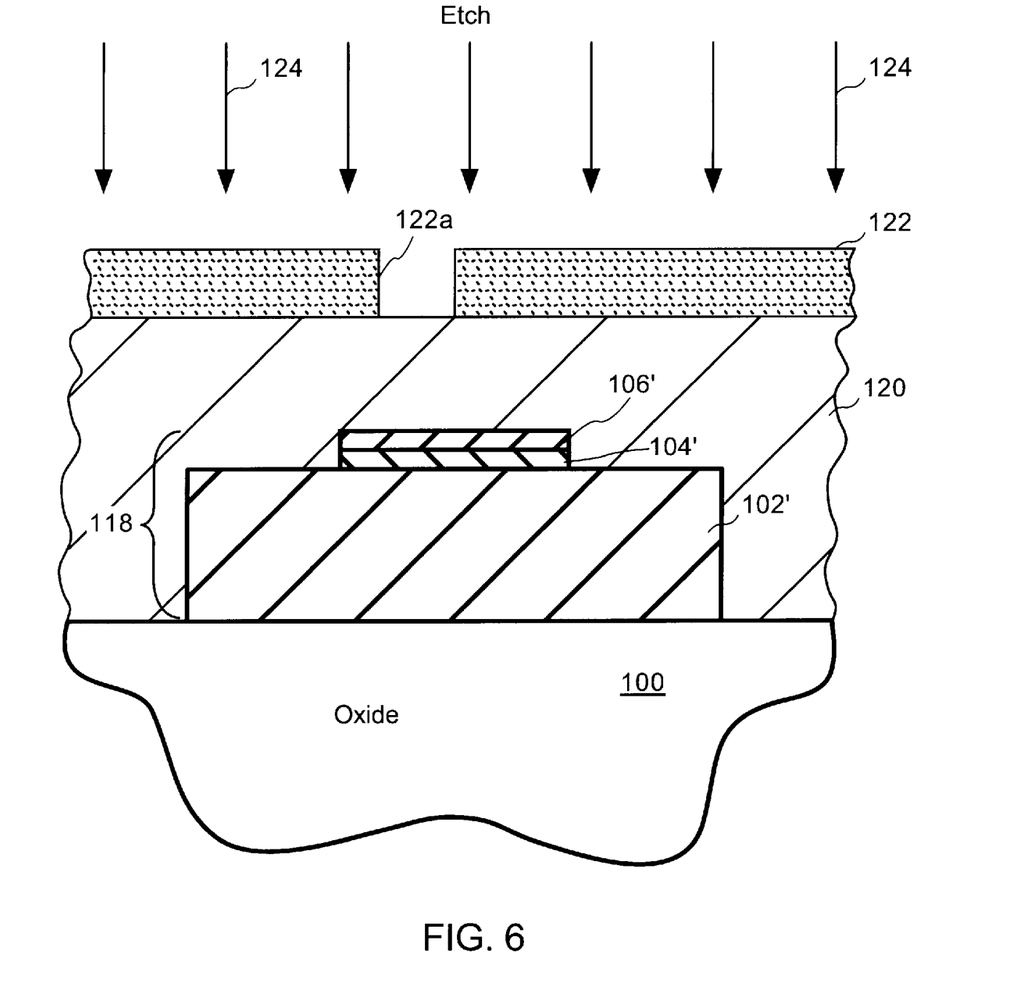
FIG. 6 shows the formation of a via to the patterned metallization layer, in accordance with one embodiment of the present invention.

FIG. 6 shows the formation of a via to the patterned metallization layer 106', in accordance with one embodiment of the present invention. An oxide layer 120 is shown deposited over the capacitor 118 as well as all other metallization lines formed from the metallization layer 102. The oxide layer 120 is then placed through a chemical mechanical polishing operation (CMP) in order to planarize a top surface of the oxide layer 120. A photoresist layer is then spin coated over the planarized top surface of the oxide layer 120. Afterwards, the photoresist layer is then patterned using standard photolithography techniques to define a patterned photoresist layer 122. The patterned photoresist layer 122 will therefore define a window 122a as shown.

The window 122a will allow the etching of a via down to the patterned metallization layer 106'. It should be noted that the photoresist mask 122 will also define other windows for forming other vias that may need to be formed in the oxide layer 120. After the photoresist mask 122 is defined over the oxide layer 120, an oxide etch operation 124 is performed to form a via down to the patterned metallization layer 106' as shown in FIG. 7.

Figure 7:
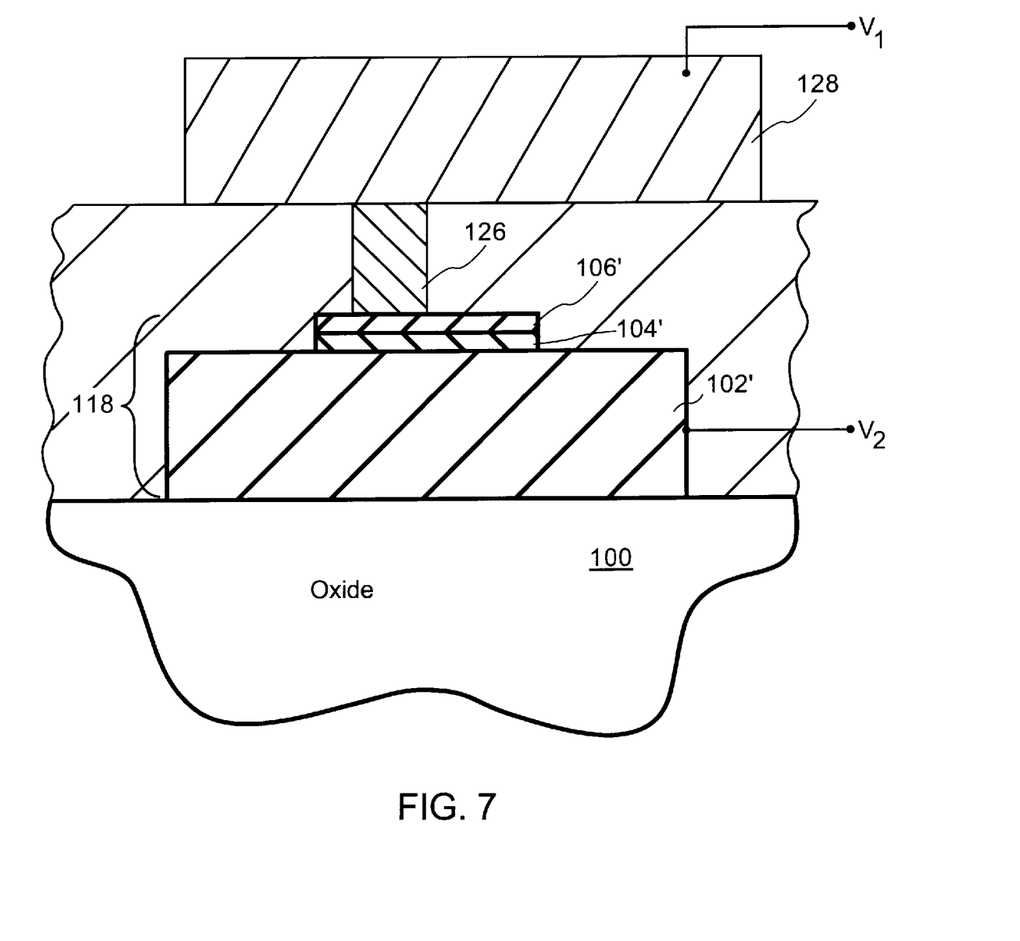
FIG. 7 shows the formation of a next metallization level above the capacitor in accordance with one embodiment of the present invention.

FIG. 7 shows the formation of a next metallization level above the capacitor 118. A via is formed by the etch operation 124 and a tungsten fill process (not shown) is performed to define a tungsten plug via 126. The tungsten plug via 126 is formed such that it is in electrical communication with the patterned metallization layer 106' of the capacitor 118. A metallization line 128 is then formed on the next metallization level immediately above the oxide layer 120. In this example, the patterned metallization layer 106' of the capacitor 118 is in electrical contact with the tungsten plug via 126 and the metallization line 128. For illustration purposes, the metallization line 128 is in electrical communication with the voltage potential $V_1$. The patterned metallization line 102' is in electrical communication with the voltage potential $V_2$.

The present invention now allows designers to have more cost-effective and space efficient semiconductor devices having capacitors. Capacitors may be used within a semiconductor device without the addition of extra metallization lines. Now, an integrated circuit having dense routing does not require the addition of another metallization line to form a capacitor within the integrated circuit, therefore, costs are kept down and the circuit is more space efficient than prior art circuits using capacitors within metallization layers.

The present invention is also more cost effective because the capacitors disclosed are fabricated during the normal fabrication operation of the semiconductor device. Only two additional operations are required to form the capacitor which occur during the normal procedure for fabricating the semiconductor device. Furthermore, the procedure for making the capacitor involves normal fabrication operations used during the fabrication of other layers within the semiconductor device. Thus, no special steps are necessary to fabricate a capacitor in accordance with the present invention.

The present invention also discloses a capacitor with high capacitance in a small amount of space. The dielectric used to form the capacitor in the present invention has a high dielectric constant. Also, the top plate of the capacitor is in close proximity to the bottom plate of the capacitor. The high dielectric constant of the dielectric and the close proximity of the plate increase the capacitance of a capacitor made in accordance with one embodiment of the present invention. The higher capacitance avoids the problems of the prior art in that the present capacitor more effectively filters low frequency and/or DC signals. Designers may rely on capacitors made in accordance with the present invention because of its high capacitance and the relatively small amount of space occupied by the capacitor.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A capacitor, comprising:

a metallization line;

a high dielectric constant layer defined over the metallization line;

a thin metallization film defined over the high dielectric constant layer, such that the thin metallization film defines a top plate of the capacitor, the high dielectric constant layer defines a dielectric for the capacitor, and the metallization line defines a bottom plate for the capacitor, wherein the metallization line is defined from a metallization level and the thin metallization film is defined before a next metallization level above the metallization level is defined.

2. A capacitor according to claim 1, further comprising:

an oxide layer defined over the thin metallization film and the metallization line of the metallization level.

3. A capacitor according to claim 2, further comprising:

a conductive via defined through the oxide layer and in conductive contact with the thin metallization film.

4. A capacitor according to claim 3, further comprising:

a next metallization line defined over the oxide layer and in contact the conductive via, the next metallization line being defined from the next metallization level that is above the metallization level.

5. A capacitor according to claim 4 wherein the next metallization line provides conductive contact to the top plate of the capacitor and the metallization line provides conductive contact to the bottom plate of the capacitor.

6. A capacitor, comprising:

a bottom plate;

a dielectric;

a top plate over the dielectric wherein the bottom plate is defined from a metallization line, the dielectric is defined from a high dielectric constant layer disposed over the bottom plate, and the top plate is defined from a thin metallization film that is disposed over the high dielectric constant layer, such that the thin metallization film is defined between the metallization line and a next metallization layer.

7. A capacitor according to claim 6, further comprising:

an oxide layer defined over the thin metallization film and the metallization line.

8. A capacitor according to claim 7, further comprising:

a conductive via in the oxide layer which is in conductive contact with the thin metallization film.

9. A capacitor according to claim 8, further comprising:

a second metallization line disposed over the oxide layer which is defined from the next metallization layer and is in electrical contact with the conductive via.

* * * * *